US009806288B2

(12) United States Patent
Lee et al.

(10) Patent No.: US 9,806,288 B2
(45) Date of Patent: Oct. 31, 2017

(54) ORGANIC LIGHT EMITTING DIODE, MANUFACTURING METHOD THEREOF, AND ORGANIC LIGHT EMITTING DISPLAY DEVICE HAVING ORGANIC LIGHT EMITTING DIODE

(71) Applicant: SAMSUNG DISPLAY CO., LTD., Yongin-si, Gyeonggi-do (KR)

(72) Inventors: Joon Gu Lee, Yongin-si (KR); Jae Ik Kim, Yongin-si (KR); Yeon Hwa Lee, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/996,624

(22) Filed: Jan. 15, 2016

(65) Prior Publication Data
US 2017/0012238 A1    Jan. 12, 2017

(30) Foreign Application Priority Data

Jul. 7, 2015  (KR) .................. 10-2015-0096639

(51) Int. Cl.
*H01L 51/52*    (2006.01)
*H01L 27/32*    (2006.01)

(52) U.S. Cl.
CPC ...... *H01L 51/5253* (2013.01); *H01L 27/3248* (2013.01); *H01L 2227/323* (2013.01); *H01L 2251/305* (2013.01); *H01L 2251/306* (2013.01); *H01L 2251/308* (2013.01); *H01L 2251/558* (2013.01)

(58) Field of Classification Search
CPC .................. H01L 51/5253; H01L 27/3248
See application file for complete search history.

(56) References Cited

U.S. PATENT DOCUMENTS

| 9,368,735 B2* | 6/2016 | Hakii ................. C07D 213/79 |
| 2004/0140757 A1 | 7/2004 | Tyan et al. |
| 2005/0037232 A1 | 2/2005 | Tyan et al. |
| 2005/0046340 A1* | 3/2005 | Kohara ................. H01L 51/525 313/504 |
| 2005/0158454 A1* | 7/2005 | Lee .......................... B05D 1/60 427/66 |
| 2007/0001570 A1 | 1/2007 | Nomura et al. |
| 2007/0133189 A1* | 6/2007 | Isobe .................. H01L 51/5281 362/19 |

(Continued)

FOREIGN PATENT DOCUMENTS

| KR | 10-2004-0066721 A | 7/2004 |
| KR | 10-2007-0003693 A | 1/2007 |

(Continued)

*Primary Examiner* — Nicholas Tobergte
(74) *Attorney, Agent, or Firm* — Lee & Morse, P.C.

(57) ABSTRACT

An organic light emitting diode, a method for manufacturing an organic light emitting diode, and an organic light emitting diode display, the OLED including a substrate; a first electrode on the substrate, the first electrode including a sequentially stacked conductive layer and transparent protective layer; a hole transfer layer on a surface of the transparent protective layer; an organic emitting layer on the hole transfer layer, the organic emitting layer emitting light having a specific color; a common layer on the organic emitting layer; and a second electrode on the common layer.

20 Claims, 6 Drawing Sheets

(56) References Cited

U.S. PATENT DOCUMENTS

| | | | |
|---|---|---|---|
| 2007/0159078 A1* | 7/2007 | Park | H01L 51/529 313/504 |
| 2007/0224524 A1* | 9/2007 | Yan | G02B 5/201 430/7 |
| 2008/0044773 A1* | 2/2008 | Kawamura | G02B 5/201 430/314 |
| 2009/0153032 A1* | 6/2009 | Tomai | H01B 1/08 313/504 |
| 2014/0193936 A1* | 7/2014 | Choi | H01L 51/5056 438/46 |

FOREIGN PATENT DOCUMENTS

| | | |
|---|---|---|
| KR | 10-2011-0095114 A | 8/2011 |
| KR | 10-2014-0089233 A | 7/2014 |

\* cited by examiner

ORGANIC LIGHT EMITTING DIODE, MANUFACTURING METHOD THEREOF, AND ORGANIC LIGHT EMITTING DISPLAY DEVICE HAVING ORGANIC LIGHT EMITTING DIODE

CROSS-REFERENCE TO RELATED APPLICATION

Korean Patent Application No. 10-2015-0096639, filed on Jul. 7, 2015, in the Korean Intellectual Property Office, and entitled: "Organic Light Emitting Diode, Manufacturing Method Thereof, and Organic Light Emitting Display Device Having Organic Light Emitting Diode," is incorporated by reference herein in its entirety.

BACKGROUND

1. Field

Embodiments relate to an organic light emitting diode, a manufacturing method thereof, and an organic light emitting display device having the organic light emitting diode.

2. Description of the Related Art

An organic light emitting diode includes two electrodes and an organic emitting layer therebetween, in which electrons injected from one electrode and holes injected from the other electrode are combined in the organic emitting layer to form excitons, and the excitons release energy to emit light.

SUMMARY

Embodiments are directed to an organic light emitting diode, a manufacturing method thereof, and an organic light emitting display device having the organic light emitting diode.

The embodiments may be realized by providing an organic light emitting diode including a substrate; a first electrode on the substrate, the first electrode including a sequentially stacked conductive layer and transparent protective layer; a hole transfer layer on a surface of the transparent protective layer; an organic emitting layer on the hole transfer layer, the organic emitting layer emitting light having a specific color; a common layer on the organic emitting layer; and a second electrode on the common layer.

The transparent protective layer may include an oxide having a work function of 5.6 eV or greater.

The transparent protective layer may include a zinc oxide, a tin oxide, an indium oxide, an indium zinc oxide, an indium tin oxide, an indium gallium zinc oxide, or an indium zinc tin oxide, or an indium gallium zinc tin oxide.

The transparent protective layer may have a thickness of 50 Å to 1,000 Å.

The transparent protective layer may have a thickness that is selected according to a wavelength of light emitted from the organic emitting layer.

The organic light emitting diode may further include a light auxiliary layer between the organic emitting layer and the hole transfer layer.

The light auxiliary layer may have a thickness that is selected according to a wavelength of light emitted from the organic emitting layer.

The common layer may include an electron transport layer on the organic emitting layer; and an electron injection layer on the electron transport layer.

The embodiments may be realized by providing a method for manufacturing an organic light emitting diode, the method including forming a first electrode such that the first electrode includes a conductive layer and a transparent protective layer sequentially stacked on a substrate; surface-treating an upper surface of the transparent protective layer to form a hole transfer layer; forming an organic emitting layer on the hole transfer layer; forming a common layer on the organic emitting layer; and forming a second electrode on the common layer.

Forming the hole transfer layer by surface-treating the upper surface of the transparent protective layer may include performing a dry plasma treatment, a wet chemical treatment, or a self-assembled monolayer coating treatment.

Forming the hole transfer layer by surface-treating the upper surface of the transparent protective layer may include doping the transparent protective layer with a nickel oxide, a cobalt oxide, an iron oxide, a manganese oxide, or an ytterbium oxide.

Forming the common layer may include forming an electron transport layer on the organic emitting layer; and forming an electron injection layer on the electron transport layer.

The transparent protective layer may include an oxide having a work function of 5.6 eV or greater.

The transparent protective layer may include a zinc oxide, a tin oxide, an indium oxide, an indium zinc oxide, an indium tin oxide, an indium gallium zinc oxide, an indium zinc tin oxide, or an indium gallium zinc tin oxide.

The transparent protective layer may have a thickness of 50 Å to 1,000 Å.

The transparent protective layer may have a thickness that is selected according to a wavelength of light emitted from the organic emitting layer.

The method may further include forming a light auxiliary layer between the organic emitting layer and the hole transfer layer.

The light auxiliary layer has a thickness that is selected according to a wavelength of light emitted from the organic emitting layer.

The embodiments may be realized by providing an organic light emitting diode display including a substrate; at least one thin film transistor (TFT) on the substrate; an organic light emitting diode (OLED) on the substrate and connected to the at least one TFT to generate light having a specific color; and an encapsulating member encapsulating the OLED, wherein the OLED includes a first electrode that includes sequentially stacked conductive layer and transparent protective layer; a hole transfer layer on a surface of the transparent protective layer; an organic emitting layer on the hole transfer layer; and a second electrode on the organic emitting layer.

The transparent protective layer may include a zinc oxide, a tin oxide, an indium oxide, an indium zinc oxide, an indium tin oxide, an indium gallium zinc oxide, an indium zinc tin oxide, or an indium gallium zinc tin oxide.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
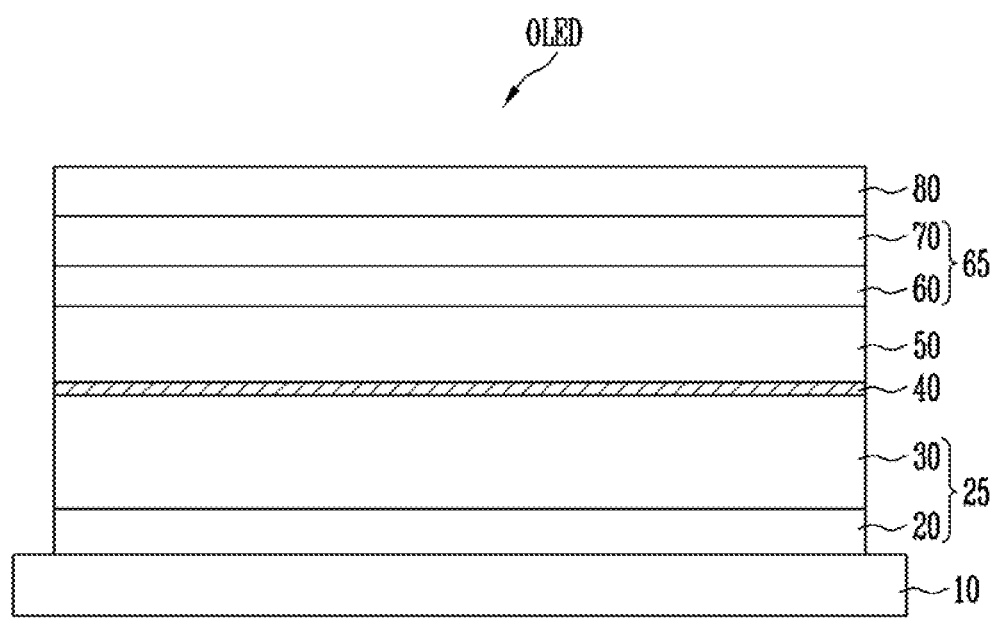
FIG. 1 illustrates a cross-sectional view of an organic light emitting diode according to a first embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In addition, it will also be understood that when a layer is referred to as being "between" two layers, it can be the only layer between the two layers, or one or more intervening layers may also be present. Like reference numerals refer to like elements throughout.

In order to clarify the embodiments, parts that are not connected with the description may be omitted.

In the drawings, the thickness of layers, films, regions, etc., may be exaggerated for clarity. Also, in the drawings, the thickness of some layers and regions may be exaggerated for the sake of brevity. It will be understood that when an element such as a layer, film, region, or substrate is referred to as being "on" another element, it can be directly on the other element or intervening elements may also be present.

FIG. 1 illustrates a cross-sectional view of an organic light emitting diode according to a first embodiment.

Referring to FIG. 1, an organic light emitting diode (OLED) according to a first embodiment may include a first electrode 25 on a substrate 10, a hole transfer layer 40 on the first electrode 25, an organic emitting layer 50 on the hole transfer layer 40, a common layer 65 on the organic emitting layer 50, and a second electrode 80 on the common layer 65.

The substrate 10 may be, e.g., a glass substrate or a plastic substrate. The OLED may be directly mounted on one surface of the substrate 10 or may be on an insulating layer that is on one surface of the substrate 10. The insulating layer may include an organic layer and/or an inorganic layer.

The first electrode 25 and the second electrode 80 may receive voltages having different levels. In an implementation, the first electrode 25 may be an anode electrode and the second electrode 80 may be a cathode electrode.

The first electrode 25 may include a conductive layer 20 and a transparent protective layer 30 on the conductive layer 20.

The conductive layer 20 may be formed of or include, e.g., a light-reflective metal material. The light-reflective metal material may include, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or a compound thereof.

The transparent protective layer 30 may be formed of or include, e.g., a material having high conductivity and work function. The transparent protective layer 30 may be, e.g., a transparent conductive oxide. The transparent conductive oxide may include, e.g., a zinc oxide, a tin oxide, an indium oxide, an indium zinc oxide, an indium tin oxide, an indium gallium zinc oxide, an indium zinc tin oxide, and/or an indium gallium zinc tin oxide.

The transparent protective layer 30 may have a thickness of, e.g., 50 Å to 1,000 Å. The thickness of the transparent protective layer 30 may vary or be selected according to colors (or wavelengths) of light output or emitted from the organic emitting layer 50.

The organic emitting layer 50 may be on the hole transfer layer 40. The organic emitting layer 50 may generate or emit, e.g., blue light, green light, red light, or white light. The organic emitting layer 50 may include, e.g., a fluorescent material or phosphorescent material.

The common layer 65 may include an electron transport layer 60 (on the organic emitting layer 50) and an electron injection layer 70 (on the electron transport layer 60).

The second electrode 80 may be on the common layer 65. The second electrode 80 may be formed of or include, e.g., a material having a low work function. In an implementation, the second electrode 80 may include, e.g., Ag, Mg, Al, Pt, Pd, Au, Ni, Nd, Ir, Cr, Li, Ca, and/or a compound thereof.

An upper surface of the transparent protective layer 30 may be surface-treated to form a hole transfer layer 40. The surface treatment may include, e.g., a dry plasma treatment using $Cl_2$ gas, a wet chemical treatment, and/or a self-assembled monolayer (SAM) coating treatment. In an implementation, the surface treatment may include a treatment of doping the upper surface of the transparent protective layer 30 with an oxide, e.g., a nickel oxide, a cobalt oxide, an iron oxide, a manganese oxide, and/or an ytterbium oxide.

Due to the foregoing surface treatment, the upper surface of the transparent protective layer 30, i.e., the hole transfer layer 40, may have a work function of 5.6 eV or greater, having high hole mobility.

Table 1 below shows the effects of increasing the work function of the upper surface of the transparent protective layer 30, i.e., the hole transfer layer 40, through the surface treatment.

TABLE 1

| Sample name | Ref ITO (control group) | ITO (experimental group) |
| --- | --- | --- |
| Before treatment | 4.80 eV | 4.80 eV |
| UV-$O_3$ treated | 5.20 eV | — |
| $Cl_2$ treated | — | 5.90 eV |
| 8 hours after treatment | 5.00 eV | 5.85 eV |

If the upper surface of the indium tin oxide (ITO) is not treated, both the control group and the experimental group may have a work function of 4.08 eV.

If the upper surface of the ITO of the control group is treated with UV-O$_3$, the ITO of the control group may obtain a work function of 5.20 eV. If plasma treatment using a Cl$_2$ gas is performed on an upper surface of the ITO of the experimental group, the ITO of the experimental group may obtain a work function value of 5.90 eV.

An ITO of the control group surface-treated with UV-O$_3$ may obtain a work function value of 5.00 eV after the lapse of 8 hours. A plasma-treated ITO of the experimental group may obtain a work function value of 5.90 eV after the lapse of 8 hours.

If surface-treated, the work function value of ITO may increase from 4.8 eV to 5.9 eV. A plasma surface treatment using the Cl$_2$ gas, compared with the treatment of UV-O$_3$, may be stably maintained after the surface treatment.

Here, in a case in which the OLED according to the first embodiment employs a microcavity structure, the transparent protective layer 30 may have a thickness that varies or is selected according to colors (or wavelengths) of light output or emitted from the organic emitting layer 50.

The transparent protective layer 30 may secure a microcavity distance between the first electrode 25 and the second electrode 80 according to colors (or wavelengths) output from the organic emitting layer 50.

For example, a thickness of the transparent protective layer 30 when the organic emitting layer 50 outputs red (R) light or green (G) light may be greater than a thickness of the transparent protective layer 30 when the organic emitting layer 50 outputs blue (B) light. For example, the thickness of the transparent protective layer 30 at a region or pixel of an OLED display at which red or green light is emitted may be thicker than the thickness of the transparent protective layer 30 at a region or pixel of the OLED display at which blue light is emitted.

Table 2 below shows emission efficiency of light output from the organic emitting layer 50 by colors according to an difference in thickness of the transparent protective layer 30, according to whether the hole transport layer (HTL) is applied.

TABLE 2

| Classification | | Thickness of transparent protective layer (ITO) | Thickness of HTL | Color coordinates (x, y) | Efficiency |
|---|---|---|---|---|---|
| Blue (B) | Control group (Ref) | 7 nm | 120 nm | 0.136, 0.053 | 1087 |
| | Experimental group | 30 nm | — | 0.134, 0.082 | 837 |
| Green (G) | Control group (Ref) | 7 nm | 165 nm | 0.259, 0.705 | 173.2 |
| | Experimental group | 30 nm | — | 0.254, 0.694 | 180.3 |
| Red (R) | Control group (Ref) | 7 nm | 205 nm | 0.674, 0.326 | 237.1 |
| | Experimental group | 30 nm | — | 0.654, 0.346 | 195.3 |

When the organic emitting layer 50 emits blue (B) light, the control group Ref may have a transparent protective layer (ITO) having a thickness of 7 nm and a hole transfer layer (HTL) having a thickness of 120 nm, and the experimental group may have a transparent protective layer (ITO) having a thickness 30 nm. When the organic emitting layer 50 emits green (G) light, the control group Ref may have a transparent protective layer (ITO) having a thickness of 7 nm and a hole transfer layer (HTL) having a thickness of 165 nm, and the experimental group may have a transparent protective layer (ITO) having a thickness 30 nm. When the organic emitting layer 50 emits red (R) light, the control group Ref may have a transparent protective layer (ITO) having a thickness of 7 nm and a hole transfer layer (HTL) having a thickness of 205 nm, and the experimental group may have a transparent protective layer (ITO) having a thickness 30 nm.

Here, in order to help secure the microcavity distance according to colors of light output from the organic emitting layer 50, the hole transfer layers (HTL) of the control group (Ref) may be set to different thicknesses.

When the organic emitting layer 50 emits blue (B) light, green (G) light, and red (R) right, the control group (Ref) and the experimental group may exhibit emission efficiency having a relatively same level, as can be seen through the color coordinates (x, y) of Table 2.

Table 3 below shows emission efficiency of blue (B) light output from the organic emitting layer 50 according to a difference in thickness of the transparent protective layer 30 and according to whether the hole transfer layer (HTL) is applied when the organic emitting layer 50 emits blue (B) light.

TABLE 3

| | Classification | Thickness of transparent protective layer (ITO) | Thickness of hole transfer layer (HTL) | Color coordinates (x, y) | Efficiency |
|---|---|---|---|---|---|
| Blue (B) | Experimental group 1 | 50 Å | 1,200 Å | (0.143, 0.039) | 876.92308 |
| | Experimental group 2 | 70 Å | 1,200 Å | (0.142, 0.042) | 945.2381 |
| | Experimental group 3 | 150 Å | — | (0.14, 0.072) | 944.44444 |
| | Experimental group 4 | 300 Å | — | (0.139, 0.078) | 1180.7692 |
| | Experimental group 5 | 500 Å | — | (0.142, 0.07) | 964.28571 |

The Experimental group 1 may be set to have a transparent protective layer (ITO) having a thickness of 50 Å and a hole transfer layer (HTL) having a thickness of 1,200 Å, and the experimental group 2 may be set to have a transparent protective layer (ITO) having a thickness of 70 Å and a hole transfer layer (HTL) having a thickness of 1,200 Å.

The experimental group 3 may be set to have only a transparent protective layer (ITO) having a thickness of 150 Å, the experimental group 4 may be set to have only a transparent protective layer (ITO) having a thickness of 300 Å, and the experimental group 5 may be set to have only a transparent protective layer (ITO) having a thickness of 500 Å.

As can be seen from the color coordinates (x, y) illustrated in Table 3, the experimental groups 1 and 2 (including the hole transfer layer (HTL)) and the experimental groups 3 through 5 (not including the hole transfer layer (HTL) and including a transparent protective layer (ITO) thicker than the transparent protective layer (ITO) of the experimental groups 1 and 2) may have the same level of emission efficiency.

As described above, in the OLED according to the first embodiment, the hole transfer layer 40 having a high work function value may be formed by surface-treating the upper surface of the transparent protective layer 30, and hole mobility may be enhanced.

In addition, in the OLED according to the first embodiment, the hole transfer layer 40 having a high work function may be replaced with a hole transport layer (HTL) or a hole injection layer (HIL), a structure may be simplified and manufacturing cost may be reduced.

In addition, in the OLED according to the first embodiment, the hole transport layer HTL or the hole injection layer HIL may be surface-treated using a sputtering process, instead of an organic material deposition process, a manufacturing process may be simplified.

In an implementation, in the OLED according to the first embodiment, a hole transport layer or an electron blocking layer may be positioned between the hole transfer layer 40 and the organic emitting layer 50. The hole transport layer or the electron blocking layer may have a thickness of 200 Å or smaller.

FIGS. 2A through 2G illustrate cross-sectional views of stages in a method for manufacturing the organic light emitting diode of FIG. 1.

Figure 2A:
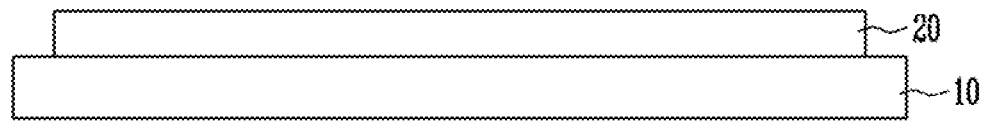
FIGS. 2A through 2G illustrate cross-sectional views of stages in a method for manufacturing the organic light emitting diode of FIG. 1.

Referring to FIG. 2A, the conductive layer 20 may be formed on the substrate 10. For example, the conductive layer 20 may be formed of a light-reflective metal material. The light-reflective metal material may include, e.g., Ag, Mg, Al, Pt, Pd, Au, Ni, Nd, Ir, Cr, Li, Ca, and/or a compound thereof.

Figure 2B:
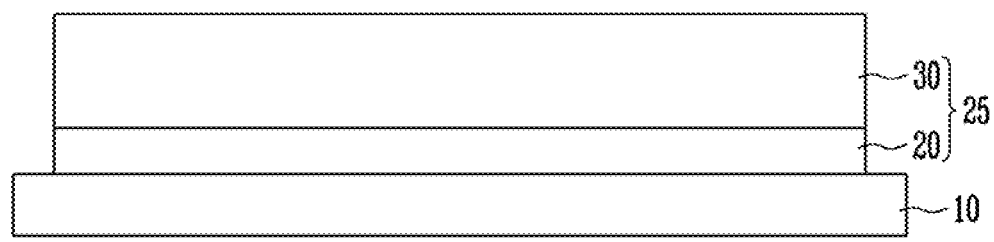

Referring to FIG. 2B, the transparent protective layer 30 may be formed on the conductive layer 20.

The transparent protective layer 30 may be formed of a material having high conductivity and work function. The transparent protective layer 30 may include a transparent conductive oxide. The transparent conductive oxide may include, e.g., a zinc oxide, a tin oxide, an indium oxide, an indium zinc oxide, an indium tin oxide, an indium gallium zinc oxide, an indium zinc tin oxide, and/or an indium gallium zinc tin oxide.

Figure 2C:
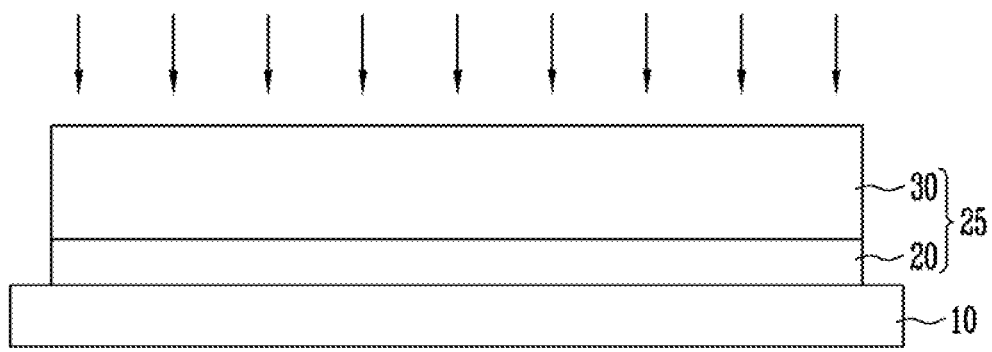

Referring to FIG. 2C, an upper surface of the transparent protective layer 30 may be surface-treated. The surface treatment may include, e.g., a dry plasma treatment using $Cl_2$ gas, a wet chemical treatment, and/or a self-assembled monolayer (SAM) coating treatment. In an implementation, the surface treatment may include a treatment of doping the upper surface of the transparent protective layer 30 with an oxide, e.g., a nickel oxide, a cobalt oxide, an iron oxide, a manganese oxide, and/or an ytterbium oxide.

Figure 2D:
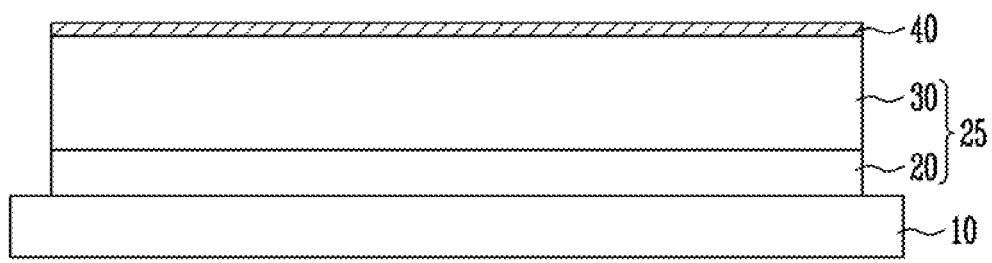

Due to the foregoing surface treatment, the hole transfer layer 40 may be formed on the upper surface of the transparent protective layer 30 as illustrated in FIG. 2D. The hole transfer layer 40 may have a work function of 5.6 eV or greater, and may have high hole mobility.

Figure 2E:
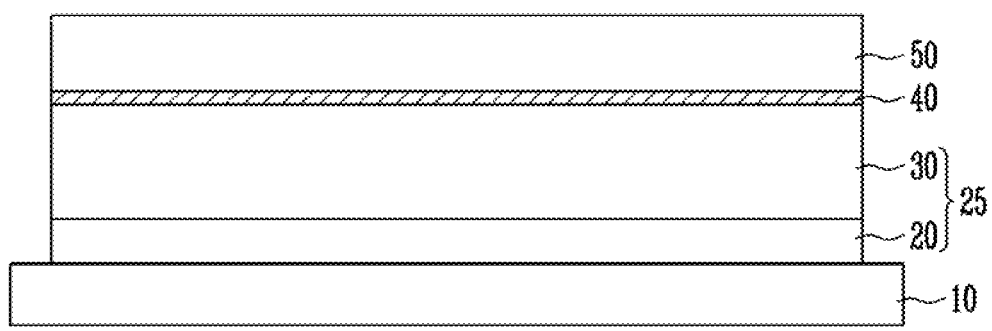

Referring to FIG. 2E, an organic emitting layer 50 may be formed on the surface-treated hole transfer layer 40. The organic emitting layer 50 may be provided in the form of a liquid phase including a fluorescent material or a phosphorescent material and may be formed through printing or an inkjet method. An emissive material forming the organic emitting layer 50 may include, e.g., a material able to emit light having a desired emission wavelength and having desired emission efficiency.

For example, when red (R) light is desired, a material exhibiting emission and having a peak ranging from 600 nm to 680 nm in an emission spectrum, such as 4-dicyanomethylene-2isopropyl-6[2-(1,1,7,7,-tetramethyljulolidine-9-il)ethenyl]-4H-pyran (acronym: DCJTI), 4-dicyanomethylene-2-methyl-6[2-(1,1,7,7,-tetramethyl-9-julolidine-9-il) ethenyl]-4H-pyran (acronym: DCJT), 4-dicyanomethylene-2-tert-butyl-6[2-(1,1,7,7,-tetramethyljulolidine-9-il) ethenyl]-4H-pyran (acronym: DCJTB), periplanoten, or 2,5-dicyano-1,4-bis [2-(10-methoxy-1,1,7,7,-tetramethyljulolidine-9-il)ethenyl]benzene, may be used.

When green (G) light is desired, a material exhibiting emission and having a peak ranging from 500 nm to 550 nm in an emission spectrum, such as N,N'-dimethylquinacridone (acronym: DMQd), coumarin 6, or coumarin 545T tris(8-quinolinolato)aluminum (acronym: Alq3), may be used.

When blue (B) light is desired, a material exhibiting emission and having a peak ranging from 420 nm to 500 nm in an emission spectrum, such as 9,10-bis(2-naphthyl)-tert-butylanthracene (acronym: tBuDNA), 9,9'-bianthryl, 9,10-diphenylanthracene (acronym: DPA), 9,10-bis(2-naphthyl) anthracene (acronym: DNA or ADN), bis(2-methyl-8-quinolinolato)-4-phenylphenolato-gallium (acronym: BGaq), or bis(2-methyl-8-quinolinolato)-4-phenylphenolato-aluminum (acronym: BAlq), may be used.

Figure 2F:
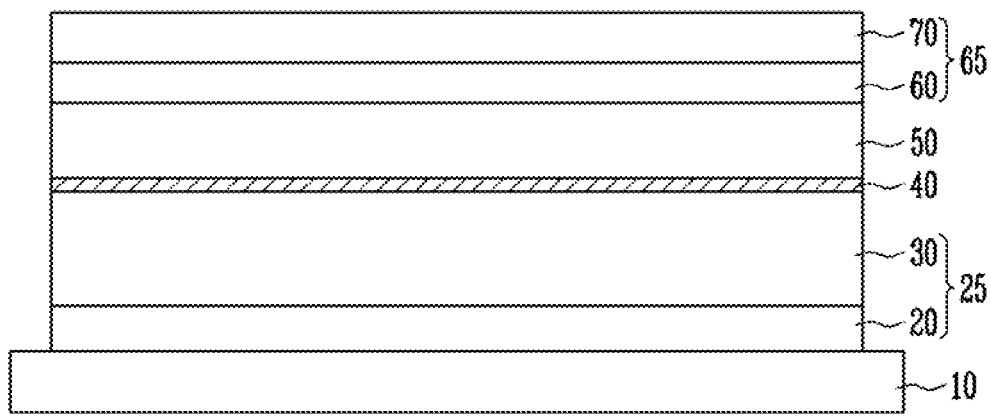

Referring to FIG. 2F, a common layer 65 may be formed on the organic emitting layer 50. The common layer 65 may include an electron transport layer 60 and an electron injection layer 70.

In order to increase electron mobility, the electron transport layer 60 may include, e.g., 4,7-diphenyl-1,10-phenanthroline. The electron transport layer 60 may be formed in the same manner as that of the electron injection layer 70 and may be formed on the organic emitting layer 50 by using various methods, e.g., vacuum deposition, spin coating, casting, or a Langmuir-Blodgett method.

Figure 2G:
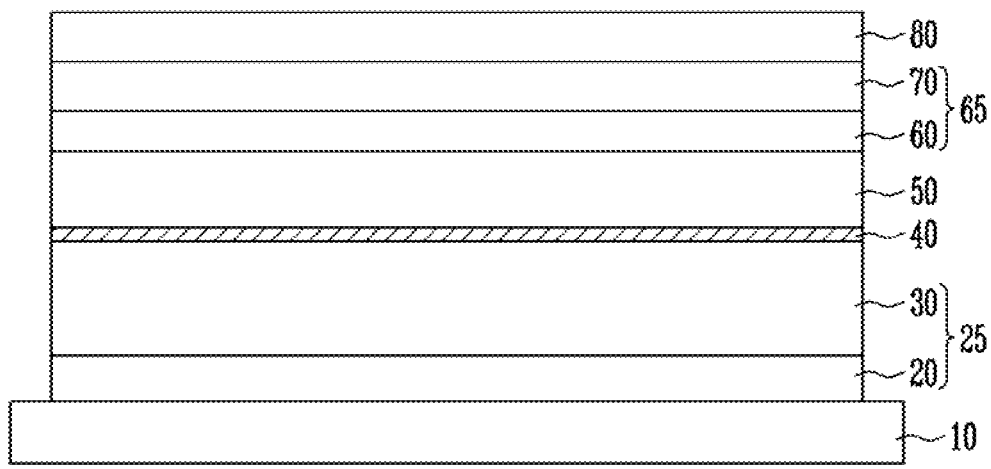

Referring to FIG. 2G, a second electrode 80 may be formed on the common layer 65. In a case in which the second electrode 80 is a cathode electrode, the second electrode 80 may be formed as a thin film formed of a conductive material having a low work function to have desired light transmittance. As a material of the second electrode 80, a material having light transmittance, as well as having small absorption and high reflectivity, may be used. Such a material may include, e.g., Ag, Mg, Al, Pt, Pd, Au, Ni, Nd, Ir, Cr, Li, Ca, and/or a compound thereof.

Figure 3:
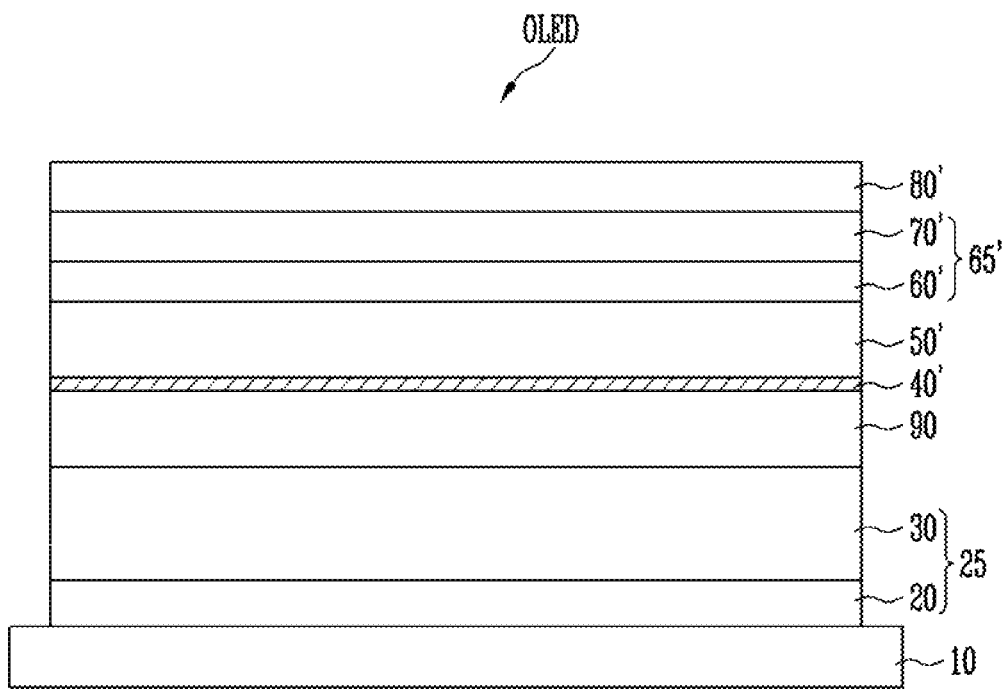
FIG. 3 illustrates a cross-sectional view of an organic light emitting diode according to a second embodiment.

FIG. 3 illustrates a cross-sectional view of an organic light emitting diode (OLED) according to a second embodiment. A difference between the OLED according to the second embodiment and the OLED according to the first embodiment will be described in order to avoid redundant description. Portions not particularly described in the embodiment may follow the OLED according to the first embodiment, and the same reference numerals denote the same components and similar reference numerals denote similar components.

Referring to FIG. 3, the organic light emitting diode (OLED) according to the second embodiment may include, e.g., a first electrode 25 on a substrate 10, a light auxiliary layer 90 on the first electrode 25, a hole transfer layer 40' on the light auxiliary layer 90, an organic emitting layer 50' on the hole transfer layer 40', a common layer 65' on the organic emitting layer 50', and a second electrode 80' on the common layer 65'.

The first electrode 25 may be an anode electrode on the substrate 10, and may include, e.g., a sequentially stacked conductive layer 20 and transparent protective layer 30.

The transparent protective layer 30 may be formed of or include a material having high conductivity and work function. The transparent protective layer 30 may be, e.g., a transparent conductive oxide. The transparent conductive oxide may include, e.g., a zinc oxide, a tin oxide, an indium oxide, an indium zinc oxide, an indium tin oxide, an indium gallium zinc oxide, an indium zinc tin oxide, and/or an indium gallium zinc tin oxide.

The light auxiliary layer 90 may be on the transparent protective layer 30. In order to control a microcavity distance according to colors (or wavelengths) of light output or emitted from the organic emitting layer 50', the light auxiliary layer 90 may be formed between the transparent protective layer 30 and the organic emitting layer 50'. For example, the light auxiliary layer 90 may be provided within a corresponding OLED (e.g., a single pixel) only when the organic emitting layer 50' emits red (R) light or green (G) light, and may not be provided within an OLED emits blue (B) light.

The light auxiliary layer 90 may include an inorganic insulating material configured as a monolayer formed of or including, e.g., a silicon oxide (SiOx) film or a silicon oxynitride (SiOxNy) film, or a stacked film including two or more types of films, e.g., a silicon oxide (SiOx) film and/or a silicon oxynitride (SiOxNy) film.

An upper surface of the light auxiliary layer 90 may be surface-treated to form a hole transfer layer 40'. The surface treatment may include, e.g., a dry plasma treatment using $Cl_2$ gas, a wet chemical treatment, and/or a self-assembled monolayer (SAM) coating treatment. In an implementation, the surface treatment may include a treatment of doping the upper surface of the light auxiliary layer 90 with an oxide, e.g., a nickel oxide, a cobalt oxide, an iron oxide, a manganese oxide, and/or an ytterbium oxide.

Due to the foregoing surface treatment, the upper surface of the light auxiliary layer 90, i.e., the hole transfer layer 40', may have a work function of 5.6 eV or greater, and may have high hole mobility.

As described above, in the OLED according to the second embodiment, the hole transfer layer 40' having a high work function value may be formed by performing surface treatment on the upper surface of the light auxiliary layer 90, and an injection barrier of holes may be lowered to enhance mobility of holes.

Also, in the OLED according to the second embodiment, the hole transfer layer 40' surface-treated with a transparent conductive oxide may replace a hole transport layer (HTL) or a hole injection layer (HIL), e.g., organic materials. Thus, a manufacturing process of the OLED according to the second embodiment may be simplified and manufacturing cost thereof may be reduced.

Figure 4:
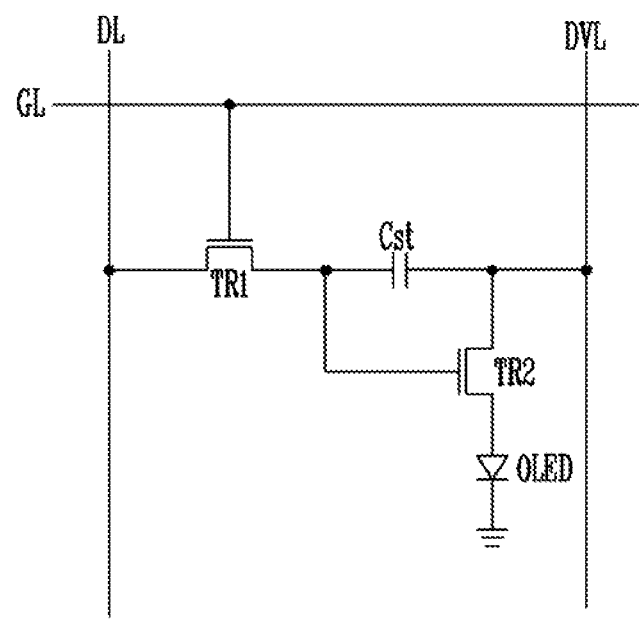
FIG. 4 illustrates a circuit diagram of an organic light emitting display device employing the organic light emitting diode according to the first embodiment.
Figure 5:
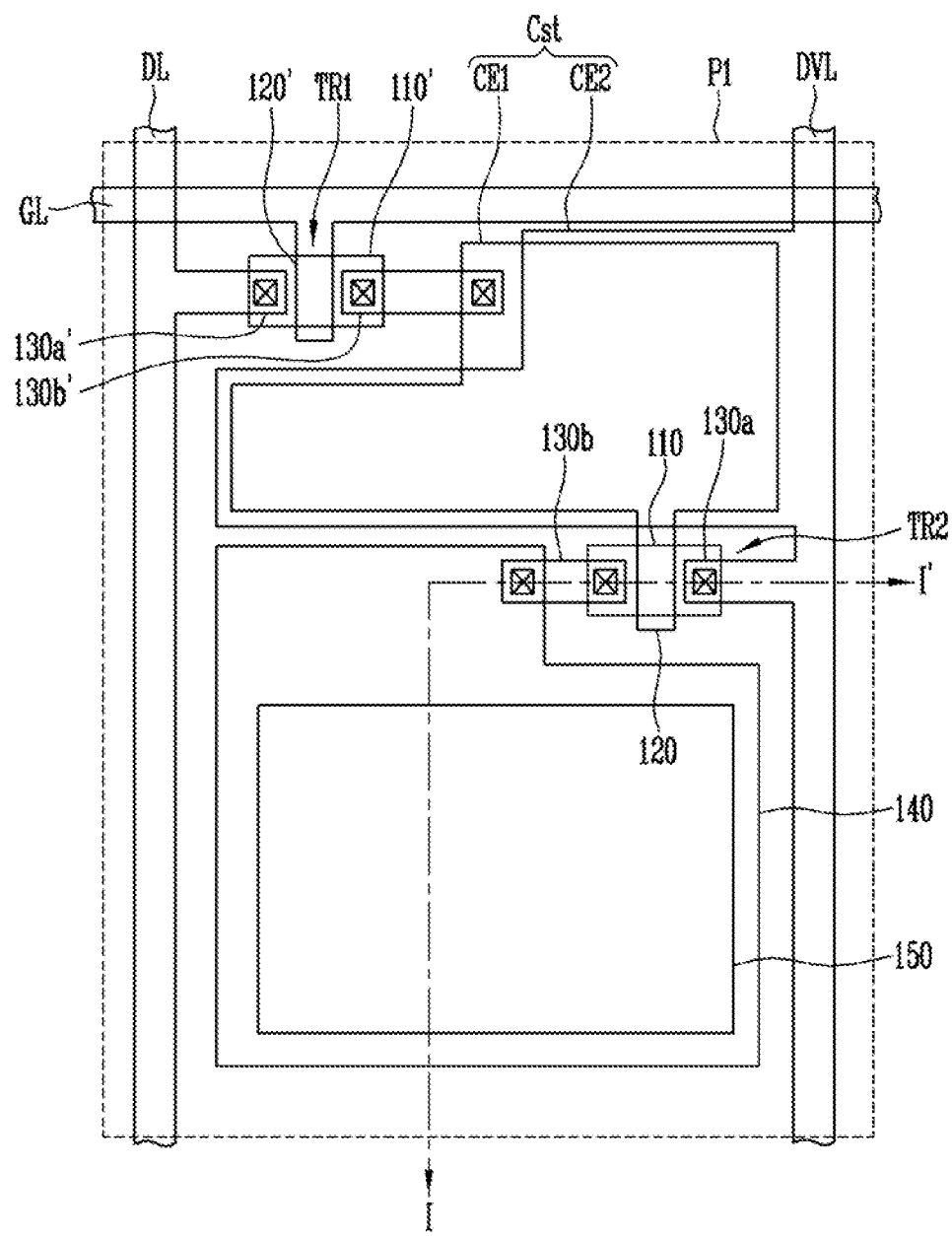
FIG. 5 illustrates a plan view of an organic light emitting display device according to an embodiment.
Figure 6:
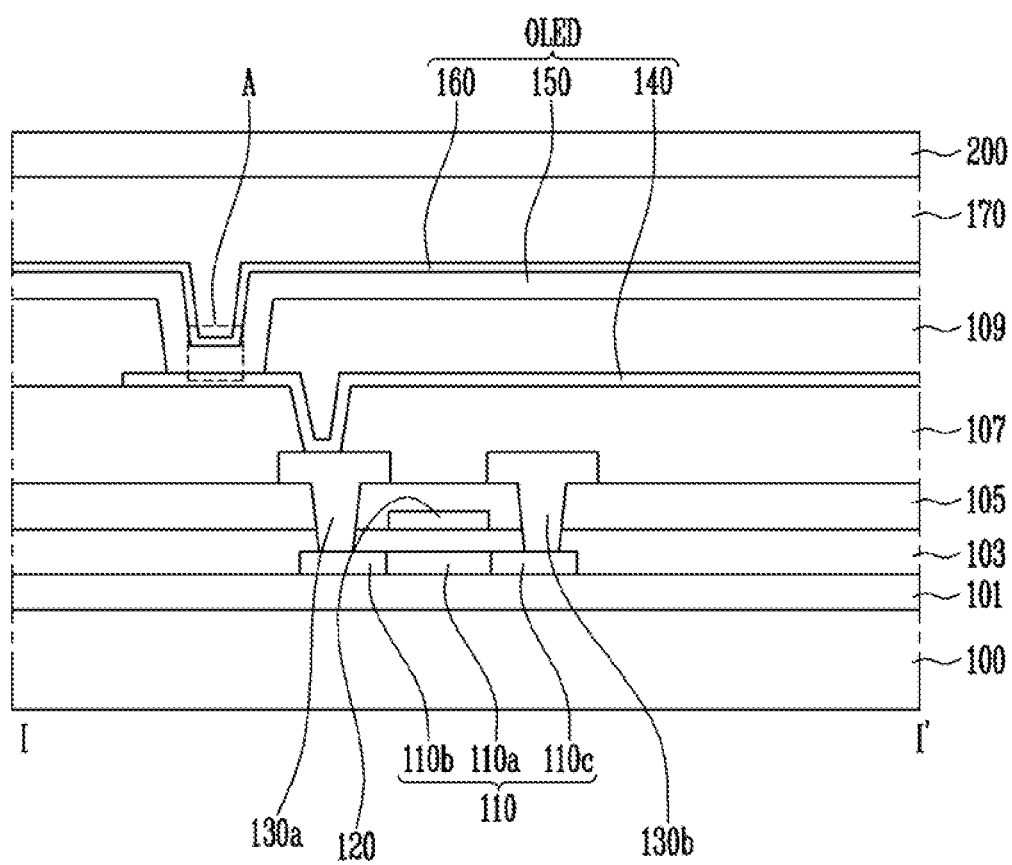
FIG. 6 illustrates a cross-sectional view taken along line I-I' of FIG. 5.
Figure 7:
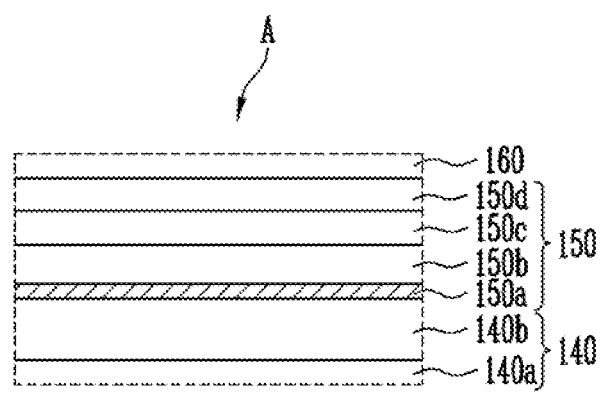
FIG. 7 illustrates an enlarged view of a portion 'A' of FIG. 6.

FIG. 4 illustrates a circuit diagram of an organic light emitting display device employing the organic light emitting diode according to, the first embodiment, FIG. 5 illustrates a plan view illustrating an organic light emitting display device according to an embodiment, FIG. 6 illustrates a cross-sectional view taken along line I-I' of FIG. 5, and FIG. 7 illustrates an enlarged view of a portion 'A' of FIG. 6.

Hereinafter, an organic light emitting display device according to an embodiment will be described with reference to FIGS. 4 through 7.

Referring to FIGS. 4 through 7, the organic light emitting display device according to an embodiment may include, e.g., a first substrate 100, a second substrate 200 facing the first substrate 100, and an encapsulating layer 170 filled between the first substrate 100 and the second substrate 200.

The first substrate 100 may be formed of a material having excellent mechanical strength or dimension stability to form a device. The material of the first substrate 100 may include, e.g., a glass substrate, a metal substrate, a ceramic substrate, or plastic (a polycarbonate resin, an acryl resin, a polyvinyl chloride resin, a polyethyleneterephthalate resin, a polyimide resin, a polyester resin, an epoxy resin, a silicon resin, and a fluoride resin).

The second substrate 200 may face the first substrate 100 and may serve as an encapsulating member isolating the first substrate 100 from an external environment.

The plurality of pixels may be arranged in a matrix form. Each of the pixels may represent various colors, and in the embodiment, an example in which each pixel outputs light having a specific color, e.g., one of red (R) light, green (G) light, and blue (B) light will be described.

Each of the pixels includes a signal line, a thin film transistor (TFT) connected to the signal line, an OLED connected to the TFT, and a capacitor Cst.

The signal line includes a plurality of gate lines GL, a plurality of data lines DL, and a driving voltage line DVL.

The gate line GL extends in a first direction (e.g., a row direction). The data line DL extends in a second direction (e.g., a column direction) perpendicular to the first direction. The driving voltage line DVL extends substantially in the same direction as that of the data line DL. The gate line GL transfers a scan signal to the TFT, the data line DL provides a driving voltage to the TFT.

The TFT may include a driving TFT TR2 for controlling the OLED, and a switching TFT TR1 for switching the driving TFT TR2. In an embodiment, it is described that one pixel includes two transistors TR1 and TR2, or one TFT and one capacitor may be provided in one pixel, or three or more TFTs and two or more capacitors may be provided in one pixel.

The switching TFT TR1 includes a first semiconductor pattern 110', a first gate electrode 120', a first source electrode 130', and a first drain electrode 130b'. The first gate electrode 120' is connected to the gate line GL, and the first source electrode 130' is connected to the data line DL. The first drain electrode 130b' is connected to the second gate electrode 120 of the driving TFT TR2. The switching TFT TR1 transfers a data signal applied to the data line DL to the driving TFT TR2 according to a scan signal applied to the gate line GL.

The driving TFT T2 includes a second semiconductor pattern 110, a second gate electrode 120, a second source electrode 130a, and a second drain electrode 130b. The second gate electrode 120 is connected to the switching TFT TR1, the second source electrode 130a is connected to the driving voltage line DVL, and the second drain electrode 130b is connected to the OLED.

The OLED may include a first electrode 140, an emitting layer 150 on the first electrode 140, and a second electrode 160 on the emitting layer 150.

The first electrode 140 is connected to the second drain electrode 130b of the driving TFT TR2.

The capacitor Cst includes a first capacitor electrode CE1 connected to the drain electrode 130b of the switching TFT TR1 and a second capacitor electrode CE2 positioned on the first capacitor electrode CE1. The capacitor Cst is connected between the second gate electrode 120 and the second source electrode 130b of the driving TFT TR2, and charges and maintains a data signal input to the second gate electrode 120 of the driving TFT TR2.

The capacitor Cst is connected between the second electrode 120 and the second source electrode 130a of the driving TFT TR2, and charges and maintains data input to the second gate electrode 120 of the driving TFT TR2.

A common voltage is applied to the second electrode 160, and the emitting layer 150 may output light according to an output signal from the driving TFT TR2 to display an image.

Hereinafter, the organic light emitting display device according to an embodiment will be described in a stacking order.

The organic light emitting display device according to an embodiment of the present invention includes a first substrate 100 on which a TFT and an OLED are stacked.

A buffer layer 101 may be formed on the first substrate 100. The buffer layer 101 may help prevent an impurity from being spread to the switching TFT TR1 and the driving TFT TR2. The buffer layer 101 may be formed of, e.g., a silicon nitride (SiNx), a silicon oxide (SiOx), or a silicon oxynitride (SiOxNy). In an implementation, the buffer layer 101 may be omitted according to a material of the first substrate 100 and a process condition.

A first semiconductor pattern 110' and a second semiconductor pattern 110 may be disposed on the buffer layer 101. The first semiconductor pattern 110' and the second semiconductor pattern 110 may be formed of a semiconductor material, and may operate as active layers of the switching TFT TR1 and the driving TFT TR2, respectively.

The first semiconductor pattern 110' and the second semiconductor pattern 110 may each include a source region 110b, a drain region 110c, and a channel region 110a between the source region 110b and the drain electrode 110c. The first semiconductor pattern 110' and the second semiconductor pattern 110 may be formed of an inorganic semiconductor or an organic semiconductor. The source region 110b and the drain region 110c may be doped with an n-type impurity or a p-type impurity.

A gate insulating layer 103 may be on the first semiconductor pattern 110' and the second semiconductor pattern 110. The gate insulating layer 103 includes openings formed on the first semiconductor pattern 110' and the second semiconductor pattern 110 to expose portions of the source region 110b and the drain region 110c, respectively.

The gate insulating layer 103 may include an inorganic insulating material configured as a monolayer formed of one type of film selected from, e.g., a silicon nitride (SiNx), a silicon oxide (SiOx), and a silicon oxynitride (SiOxNy), or a stacked film including two or more types of films selected from, e.g., a silicon nitride (SiNx), a silicon oxide (SiOx), and a silicon oxynitride (SiOxNy).

A first gate electrode 120' and a second gate electrode 120 connected to the gate line GL are on the gate insulating layer 103. The first gate electrode 120' and the second gate electrode 120 cover a region corresponding to the channel region 110a of the first semiconductor pattern 110' and the second semiconductor pattern 110.

The first gate electrode 120' and the second gate electrode 120 may be formed of, e.g., a single type of metal, several types of metal, or an alloy thereof. In an implementation, the first gate electrode 120' and the second gate electrode 120 may be a single layer formed of, e.g., molybdenum (Mo), tungsten (W), aluminum neodymium (AlNd), titanium (Ti), aluminum (Al), silver (Ag), or an alloy thereof, or a mixture thereof, or may have a dual-layer or multilayer structure of, e.g., molybdenum (Mo), aluminum (Al), or silver (Ag), as low-resistive material in order to reduce line resistance.

An interlayer insulating layer 105 is on the first gate electrode 120' and the second gate electrode 120 to cover the first gate electrode 120' and the second gate electrode 120.

The interlayer insulating layer 105 may be formed of an inorganic insulating material or an organic insulating material and may include portions of the source region 110b and the drain region 110c of the first semiconductor pattern 110' and portions of the source region 110b and the drain region 110c of the second semiconductor pattern 110.

A first source electrode 130a', a first drain electrode 130b', a second source electrode 130a, a second drain electrode 130b, a data line DL, and a driving voltage line DVL may be on the interlayer insulating layer 105.

The first source electrode 130a' and the first drain electrode 130b' are in contact with the source region 110b and the drain region 110c of the first semiconductor pattern 110' by openings formed in the gate insulating layer 103 and the interlayer insulating layer 105, respectively. The second source electrode 130a and the second drain electrode 130b are in contact with the source region 110b and the drain region 110c of the second semiconductor pattern 110 by openings formed in the gate insulating layer 103 and the interlayer insulating layer 105, respectively.

The first source electrode 130a', the first drain electrode 130b', the second source electrode 130a, the second drain electrode 130b, the data line DL, and the driving voltage line DVL may be formed of a single metal or may be formed of two or more metals or an alloy of two or more types of metals.

In an implementation, the first source electrode 130a', the first drain electrode 130b', the second source electrode 130a, the second drain electrode 130b, the data line DL, and the driving voltage line DVL may be a single layer formed of one selected from, e.g., molybdenum (Mo), tungsten (W), molybdenum tungsten (MoW), aluminum neodymium (AlNd), titanium (Ti), aluminum (Al), silver (Ag), and an alloy thereof, or a mixture thereof, or may have a dual-layer or a multi-layer structure of, e.g., molybdenum (MO), aluminum (Al), or silver (Ag), as a low-resistive material to reduce line resistance.

A protective layer 107 may be on the first source electrode 130a', the first drain electrode 130b', the second source electrode 130a, the second drain electrode 130b, the data line DL, and the driving voltage line DVL.

The protective layer 107 may be formed of, e.g., a transparent and flowable organic insulating material for planarizing the surface by alleviating an uneven portion of a lower structure. A first electrode 140 of the OLED is on the protective layer 107. The first electrode 140 may be connected to the second drain electrode 130b of the driving TFT TR2 through a contact hole formed by the protective layer 107.

A pixel defining film 109 dividing a region in which an emitting layer 150 is to be formed may be on the first substrate 100 with the first electrode 140 formed thereon. The pixel defining film 109 may expose an upper surface of the first electrode and may protrude from the first substrate 100 along a circumference of each pixel.

The emitting layer 150 (emitting light of a specific or predetermined color) may be in the region surrounded by the pixel defining film 109. A second electrode 160 may be on the emitting layer 150. An encapsulating layer 170 covering the second electrode 160 may be on the second electrode 160.

Here, the first electrode 140, the emitting layer 150, and the second electrode 160 form an OLED.

In an implementation, as illustrated in FIG. 7, the OLED may include the first electrode 140 (including a conductive layer 140a and a transparent protective layer 140b sequentially stacked on the protective layer 107), the emitting layer 150 on the transparent protective layer 140b, and the second electrode 160 on the emitting layer 150.

The first electrode 140 and the second electrode 160 may receive voltages having different levels. The first electrode 140 may be an anode electrode, and the second electrode 160 may be a cathode electrode.

The conductive layer 140a included in the first electrode 140 may be formed of a light-reflective metal. The transparent protective layer 140b may be on the conductive layer 140a.

The transparent protective layer 140b may be formed of a material having high conductivity and work function. The transparent protective layer 140b may be, e.g., a transparent conductive oxide. The transparent conductive oxide may include, e.g., a zinc oxide, a tin oxide, an indium oxide, an indium zinc oxide, an indium tin oxide, an indium gallium zinc oxide, an indium zinc tin oxide, and/or an indium gallium zinc tin oxide.

The transparent protective layer 140b may have a thickness of, e.g., 50 Å to 1,000 Å. The thickness of the transparent protective layer 140b may vary or be selected according to colors (or wavelengths) of light output from the emitting layer 150. The emitting layer 150 may be on the transparent protective layer 140b.

The emitting layer 150 may include, e.g., a hole transfer layer 150a, an organic emitting layer 150b on the hole transfer layer 150a, an electron transport layer 150c on the organic emitting layer 150b, and/or an electron injection layer 150d on the electron transport layer 150c.

The hole transfer layer 150a may be formed as an upper surface of the transparent protective layer 140b is surface-treated. The surface treatment may include, e.g., a dry plasma treatment using $Cl_2$ gas, a wet chemical treatment, or a self-assembled monolayer (SAM) coating treatment. In an implementation, the surface treatment may include a treatment of doping the upper surface of the transparent protective layer 140b with an oxide, e.g., a nickel oxide, a cobalt oxide, an iron oxide, a manganese oxide, and/or an ytterbium oxide.

Due to the foregoing surface treatment, the upper surface of the transparent protective layer 140b, i.e., the hole transfer layer 150a, has a work function of 5.6 eV or greater, having high hole mobility. The organic emitting layer 150b may be on the hole transfer layer 150a.

The organic emitting layer 150b may be provided in the form of a liquid phase including a fluorescent material or a phosphorescent material and may be formed through, e.g., a printing or inkjet method. An emissive material forming the organic emitting layer 150b may include, e.g., a material able to emit light having a desired emission wavelength and having desired emission efficiency. The electron transport layer 150c and the electron injection layer 150d may be sequentially formed on the organic emitting layer 150b.

The electron transport layer 150c and the electron injection layer 150d may be formed in the same manner and may be formed on the organic emitting layer 150c by using various methods, e.g., vacuum deposition, spin coating, casting, and a Langmuir-Blodgett method. The second electrode 160 may be formed on the electron injection layer 150d.

In the organic light emitting display device according to an embodiment having the aforementioned structure, the hole transfer layer 150a having a high work function value may be formed on or at the upper surface of the transparent protective layer 140b through surface treatment, and hole mobility may be enhanced.

In addition, in the organic light emitting display device according to an embodiment, the hole transfer layer 150a surface-treated with a transparent conductive oxide may replace a hole transport layer (HTL) or a hole injection layer (HIL), a structure may be simplified, and manufacturing cost may be reduced.

By way of summation and review, in order to help improve luminance output efficiency of the organic light emitting diode, an organic light emitting diode employing a microcavity structure has been considered. The organic light emitting diode employing the microcavity structure may have different microcavity thicknesses according to colors (red (R), green (G), and blue (B)) of emitted light using an auxiliary light layer.

When the organic light emitting diode employing the microcavity structure is manufactured, an independent thermal evaporation process may be performed for each of the colors (red (R), green (G), and blue (B)). In such a case, the organic emitting layer and the auxiliary light layer may be formed through an independent patterning process for each of the colors (red (R), green (G), and blue (B)), and manufacturing cost and manufacturing time may be increased.

The embodiments may provide a technique that may be able to reduce manufacturing cost and manufacturing time of an organic light emitting diode employing the microcavity structure.

The embodiments may provide an organic light emitting diode, a manufacturing method thereof, and an organic light emitting display device having the organic light emitting diode, capable of simplifying a manufacturing process and reducing manufacturing cost.

As described above, in the OLED according to an embodiment, the hole transfer layer having a high work function value may be formed by performing a surface treatment on the upper surface of the transparent protective layer, and an injection barrier of holes may be lowered to enhance mobility of holes.

In addition, in the OLED according to an embodiment, the hole transfer layer may replace a hole transport layer (HTL) or a hole injection layer (HIL), e.g., organic materials, and a structure of the OLED may be simplified and manufacturing cost thereof may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode, comprising:
a substrate;
a first electrode on the substrate, the first electrode including a sequentially stacked conductive layer and transparent protective layer;
a hole transfer layer, the hole transfer layer being a surface-treated portion of the transparent protective layer;
an organic emitting layer on the hole transfer layer, the organic emitting layer emitting light having a specific color;
a common layer on the organic emitting layer; and
a second electrode on the common layer.

2. The organic light emitting diode as claimed in claim 1, wherein the surface-treated portion of the transparent protective layer includes an oxide having a work function of 5.6 eV or greater.

3. The organic light emitting diode as claimed in claim 1, wherein the transparent protective layer includes a zinc oxide, a tin oxide, an indium oxide, an indium zinc oxide, an indium tin oxide, an indium gallium zinc oxide, an indium zinc tin oxide, or an indium gallium zinc tin oxide.

4. The organic light emitting diode as claimed in claim 1, wherein the transparent protective layer has a thickness of 50 Å to 1,000 Å.

5. The organic light emitting diode as claimed in claim 1, wherein the transparent protective layer has a thickness that is selected according to a wavelength of light emitted from the organic emitting layer.

6. The organic light emitting diode as claimed in claim 1, further comprising a light auxiliary layer between the organic emitting layer and the hole transfer layer.

7. The organic light emitting diode as claimed in claim 6, wherein the light auxiliary layer has a thickness that is selected according to a wavelength of light emitted from the organic emitting layer.

8. The organic light emitting diode as claimed in claim 1, wherein the common layer includes:
an electron transport layer on the organic emitting layer; and
an electron injection layer on the electron transport layer.

9. A method for manufacturing an organic light emitting diode, the method comprising:
forming a first electrode such that the first electrode includes a conductive layer and a transparent protective layer sequentially stacked on a substrate;
surface-treating an upper surface of the transparent protective layer to form a hole transfer layer;
forming an organic emitting layer on the hole transfer layer;
forming a common layer on the organic emitting layer; and
forming a second electrode on the common layer.

10. The method as claimed in claim 9, wherein forming the hole transfer layer by surface-treating the upper surface of the transparent protective layer includes performing a dry plasma treatment, a wet chemical treatment, or a self-assembled monolayer coating treatment.

11. The method as claimed in claim 9, wherein forming the hole transfer layer by surface-treating the upper surface of the transparent protective layer includes doping the transparent protective layer with a nickel oxide, a cobalt oxide, an iron oxide, a manganese oxide, or an ytterbium oxide.

12. The method as claimed in claim 9, wherein forming the common layer includes:
forming an electron transport layer on the organic emitting layer; and
forming an electron injection layer on the electron transport layer.

13. The method as claimed in claim 9, wherein the surface treated upper surface of the transparent protective layer includes an oxide having a work function of 5.6 eV or greater.

14. The method as claimed in claim 13, wherein the transparent protective layer includes a zinc oxide, a tin oxide, an indium oxide, an indium zinc oxide, an indium tin oxide, an indium gallium zinc oxide, an indium zinc tin oxide, or an indium gallium zinc tin oxide.

15. The method as claimed in claim 9, wherein the transparent protective layer has a thickness of 50 Å to 1,000 Å.

16. The method as claimed in claim 9, wherein the transparent protective layer has a thickness that is selected according to a wavelength of light emitted from the organic emitting layer.

17. The method as claimed in claim 9, further comprising forming a light auxiliary layer between the organic emitting layer and the hole transfer layer.

18. The method as claimed in claim 17, wherein the light auxiliary layer has a thickness that is selected according to a wavelength of light emitted from the organic emitting layer.

19. An organic light emitting diode display, comprising:
a substrate;
at least one thin film transistor (TFT) on the substrate;
an organic light emitting diode (OLED) on the substrate and connected to the at least one TFT to generate light having a specific color; and
an encapsulating member encapsulating the OLED,
wherein the OLED includes:
a first electrode that includes sequentially stacked conductive layer and transparent protective layer;
a hole transfer layer, the hole transfer layer being a surface-treated portion of the transparent protective layer;
an organic emitting layer on the hole transfer layer; and
a second electrode on the organic emitting layer.

20. The organic light emitting diode as claimed in claim 19, wherein the transparent protective layer includes a zinc oxide, a tin oxide, an indium oxide, an indium zinc oxide, an indium tin oxide, an indium gallium zinc oxide, an indium zinc tin oxide, or an indium gallium zinc tin oxide.

* * * * *